US012782454B2

(12) United States Patent
Klug et al.

(10) Patent No.: US 12,782,454 B2
(45) Date of Patent: Nov. 3, 2026

(54) NUCLEAR MAGNETIC RESONANCE SPECTROSCOPY OF RECHARGEABLE POUCH CELL BATTERIES

(71) Applicant: The Government of the United States of America, as represented by the Secretary of the Navy, Arlington, VA (US)

(72) Inventors: Christopher A. Klug, Falls Church, VA (US); Stefan Benders, III, New York, NY (US); Mohadesse Mohammadi, Woodside, NY (US); Alexej Jerschow, New York, NY (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 249 days.

(21) Appl. No.: 17/365,278

(22) Filed: Jul. 1, 2021

(65) Prior Publication Data

US 2022/0003824 A1 Jan. 6, 2022

Related U.S. Application Data

(60) Provisional application No. 63/046,916, filed on Jul. 1, 2020.

(51) Int. Cl.
*G01R 31/392* (2019.01)
*G01N 24/08* (2006.01)
(Continued)

(52) U.S. Cl.
CPC .......... *G01R 31/392* (2019.01); *G01N 24/08* (2013.01); *G01R 31/364* (2019.01);
(Continued)

(58) Field of Classification Search
CPC ............... G01R 31/392; G01R 31/364; G01R 31/3865; G01R 33/4616; G01N 24/08;
(Continued)

(56) References Cited

U.S. PATENT DOCUMENTS

| | | | | |
|---|---|---|---|---|
| 5,036,426 A * | 7/1991 | Shen | ........................ | H01G 4/38 361/329 |
| 2003/0124417 A1 * | 7/2003 | Bertness | ............... | H01M 10/48 429/90 |

(Continued)

OTHER PUBLICATIONS

Benders et al., "Nuclear magnetic resonance spectroscopy of rechargeable pouch cell batteries: beating the skin depth by excitation and detection via the casing" Sci. Rep. 10, 13781 (Aug. 13, 2020).

(Continued)

*Primary Examiner* — Lal Ce Mang
(74) *Attorney, Agent, or Firm* — US Naval Research Laboratory; Joseph T. Grunkemeyer

(57) ABSTRACT

Disclosed herein is a method of: providing a circuit having: a rechargeable pouch cell battery comprising lithium and an electrically insulating coating, a first electrical lead in contact with the coating at a first location on the battery, a second electrical lead in contact with the coating at a second location on the battery, a tuning capacitor in parallel to the battery, and an impedance matching capacitor in series with the battery and the tuning capacitor; placing the battery in a magnetic field; applying a radio frequency voltage to the circuit; and detecting a $^{7}Li$ nuclear magnetic resonance signal in response to the voltage.

8 Claims, 16 Drawing Sheets

(51) Int. Cl.
*G01R 31/364* (2019.01)
*H01M 50/105* (2021.01)
*H01M 50/569* (2021.01)
*H01M 10/052* (2010.01)

(52) U.S. Cl.
CPC ....... *H01M 50/105* (2021.01); *H01M 50/569* (2021.01); *H01M 10/052* (2013.01)

(58) Field of Classification Search
CPC ............. H01M 50/105; H01M 50/569; H01M 10/052; H01M 10/0525; H01M 10/48; Y02E 60/10
See application file for complete search history.

(56) References Cited

U.S. PATENT DOCUMENTS

| | | | | |
|---|---|---|---|---|
| 2013/0171508 | A1* | 7/2013 | Kim | H01M 50/119<br>429/163 |
| 2018/0053973 | A1* | 2/2018 | Tong | H01M 50/417 |
| 2019/0013509 | A1* | 1/2019 | Park | H01M 2/345 |
| 2021/0119269 | A1* | 4/2021 | Yoon | H01M 4/133 |
| 2021/0399338 | A1* | 12/2021 | Arnold | H01M 10/44 |

OTHER PUBLICATIONS

Gerald et al., "7Li NMR study of intercalated lithium in curved carbon lattices" J. Power Sources 89 (2000) 237-243.
Gerald et al., "In situ nuclear magnetic resonance investigations of lithium ions in carbon electrode materials using a novel detector" J. Phys.: Condens. Matter 13 (2001) 8269-8285.

* cited by examiner

NUCLEAR MAGNETIC RESONANCE SPECTROSCOPY OF RECHARGEABLE POUCH CELL BATTERIES

This application claims the benefit of U.S. Provisional Application No. 63/046,916, filed on Jul. 1, 2020. The provisional application and all other publications and patent documents referred to throughout this nonprovisional application are incorporated herein by reference.

TECHNICAL FIELD

The present disclosure is generally related to characterization of pouch cell batteries.

DESCRIPTION OF RELATED ART

Power storage devices form the basis for portable electronics technology as well as for the development of electric transportation options. The demand for rechargeable batteries will significantly increase in the coming years, yet technology for adequate assessment of cells is currently relatively limited. In particular, it is vital to establish detailed nondestructive diagnostic techniques that allow identifying defects, predicting lifetimes, and determining critical failure mode progressions. A widely used technique to investigate batteries is electrical impedance spectroscopy (EIS) in which the frequency response of their electrical conductivity and permittivity is obtained as a function of temperature, depth of discharge, and at different points in the cycling process. This provides insights into cell performance, including, for example, measures of the uniformity of the material distribution, the quality of solid electrolyte interphase (SEI), the electrode porosity, and the speed of adsorption reactions. A major limitation of EIS is that it records only the global values for the device and no spatial resolution is provided.

Nuclear Magnetic Resonance (NMR) spectroscopy has proven to be a powerful technique for analyzing the properties of a broad array of materials under a wide range of physical conditions. Using radio frequency (rf) excitation, NMR signals from solids, liquids, and even gases can be obtained (Stejskal et al., *High Resolution NMR in the Solid State: Fundamentals of CP/MAS*. (Oxford University Press, New York, 1994); Friebolin, *Basic One- and Two-Dimensional NMR Spectroscopy*. 4th completely rev. and updated edn. (Wiley-VCH, Weinheim, 2005); Jackowski et al. *Gas Phase NMR*. (Royal Society of Chemistry, Cambridge, 2016)). In situ NMR spectroscopy of electrochemical cells has become a highly active research area (Chang et al. "Correlating microstructural lithium metal growth with electrolyte salt depletion in lithium batteries using $^{7}$Li MRI" *J. Am. Chem. Soc.* 137, 15209-15216; Pecher et al., "Materials' Methods: NMR in Battery Research" *Chem. Mater.* 29, 213-242 (2017); Mohammadi et al., "In situ and operando magnetic resonance imaging of electrochemical cells: A perspective" *J. Magnetic Resonance* 308 (2019) 106600). The most common experimental implementation involves placing the sample inside an inductor, typically a solenoid or a saddle coil, and adjusting the resonance of a tuned rf circuit with capacitors, inductors, and in some cases transmission lines. Using this approach, one can both deliver the rf excitation via an oscillating magnetic field and, by reciprocity, detect the NMR signal response produced. Unfortunately, for many real-world applications, e.g. commercial batteries, the material of interest is confined within a conductive container or casing, which effectively shields the sample from the rf excitation at all but the very low rf frequencies. One approach to bypass this problem, and to provide crucial device diagnostics, has been through the recently introduced inside-out MRI (ioMRI) technique, whereby one obtains information from the inside of the cell without needing the rf to penetrate into that volume (Mohammadi et al., "In situ and operando magnetic resonance imaging of electrochemical cells: A perspective" *J. Magnetic Resonance* 308 (2019) 106600; Ilott et al., "Rechargeable lithium-ion cell state of charge and defect detection by in-situ inside-out magnetic resonance imaging" *Nat. Commun.* 9, 1776 (2018); Mohammadi et al., "Diagnosing current distributions in batteries with magnetic resonance imaging" *J. Magnetic Resonance* 309 (2019) 106601; Romanenko et al., "Distortion-free inside-out imaging for rapid diagnostics of rechargeable Li-ion cells" *P. Natl. Acad. Sci. USA* 116, 18783-187896-10 (2019); Romanenko et al., "Accurate Visualization of Operating Commercial Batteries Using Specialized Magnetic Resonance Imaging with Magnetic Field Sensing" *Chem. Mater.* 32, 2107-2113 (2020)). While this method has become quite successful in terms of assessing the state of charge distribution and characterizing electrical current flow, it cannot currently distinguish directly between chemical species inside the cell since it does not provide spectroscopic information.

Previously, in another approach where the battery is part of a resonant circuit it has been demonstrated that some signals of interest could be obtained via a toroid cavity NMR resonator where a metal rod functions simultaneously as the working electrode of a compression coil cell and the central conductor of the toroid cavity (Gerald et al., "Li-7 NMR study of intercalated lithium in curved carbon lattices" *J. Power Sources* 89, 237-243 (2000); Gerald et al., "In situ nuclear magnetic resonance investigations of lithium ions in carbon electrode materials using a novel detector" *J. Phys.: Condens. Mat.* 13, 8269-8285 (2001)), but only with a specially designed container, not with an actual commercial-type cell design, which would contain a number of additional problematic components (in the case of a coin cell, that would be stainless steel and springs).

BRIEF SUMMARY

Disclosed herein is a method comprising: providing a circuit comprising: a rechargeable pouch cell battery comprising lithium and an electrically insulating coating, a first electrical lead in contact with the coating at a first location on the battery, a second electrical lead in contact with the coating at a second location on the battery, a tuning capacitor in parallel to the battery, and an impedance matching capacitor in series with the battery and the tuning capacitor; placing the battery in a magnetic field; applying a radio frequency voltage to the circuit; and detecting a $^{7}$Li nuclear magnetic resonance signal in response to the voltage.

BRIEF DESCRIPTION OF THE DRAWINGS

A more complete appreciation will be readily obtained by reference to the following Description of the Example Embodiments and the accompanying drawings.

DETAILED DESCRIPTION OF EXAMPLE EMBODIMENTS

Figure 1:
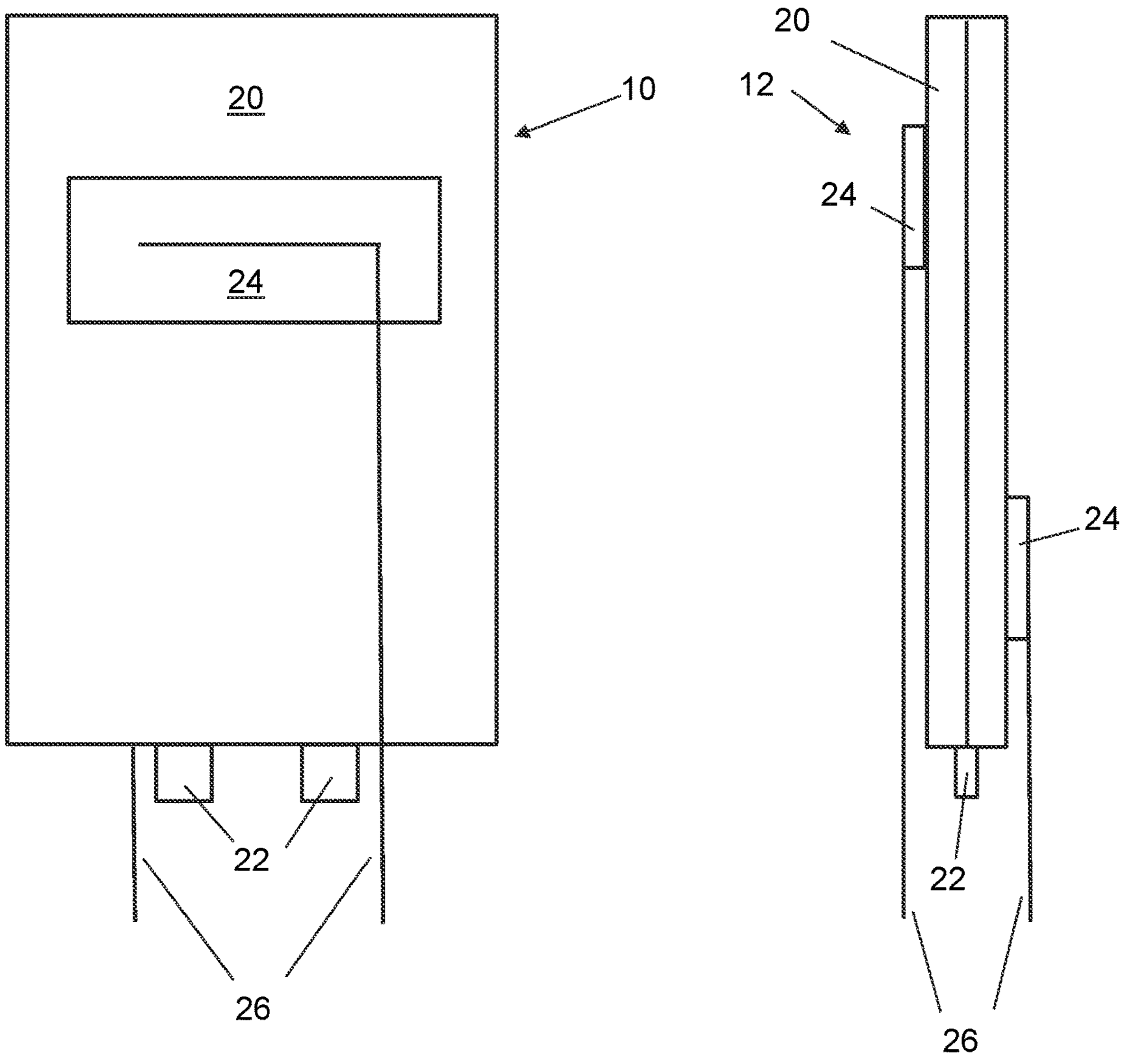
FIG. 1 shows front 10 and side 12 views of a schematic of a pouch cell battery with pads attached for feeding the rf into the cell via capacitive coupling.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

While a lot of basic battery materials research is performed using coin cells, most battery chemistries change after initial upscaling from a coin cell design to a bigger pouch cell design, and this is the stage at which many new designs fail. It is therefore of interest to be able to study these more commercially relevant designs of rolled or stacked pouch cells at advanced stages of battery research or even for quality control of manufactured or deployed cells. Multilayer and rolled pouch cells, however, represent additional significant challenges for direct NMR investigation, mostly due to rf blockage by the conductors. This work demonstrates that by incorporating a pouch cell battery directly into a tuned rf circuit, and by adjusting the tuning conditions such that the signal is transmitted via the cell's casing, it is possible to excite and detect NMR signals from the components inside the battery.

Notably, $^7$Li NMR spectra containing signals from key environments in the cell are presented. In particular, the ionic form associated with the electrolyte, the intercalated form in the graphite anode environment, as well as the metallic form due to built-up microstructure upon plating are clearly observed. Tracking these components hence becomes possible in a nondestructive fashion, thereby unlocking new characterization opportunities for crucial device diagnostics.

An advantage of this approach is the direct observation of spectroscopic information. Critical nondestructive device characterization may be performed with this technique in realistic and even commercial cell designs.

A pouch cell is typically made of a stack (or a roll) of closely spaced electrode layers with an electrolyte-soaked separator (e.g. based on glass fiber or polymer) in between. All layer thicknesses are typically of the order of 10-100 μm. The whole assembly is then usually encased by a polymer-coated Al foil pouch.

It is not obvious how one could inject rf fields into such an object. For example, one could consider a cell a resonant cavity, that is, a body that can sustain a certain type of radiation based on its dimensions and the conductive wall boundary conditions. In this case, such an analysis would be misleading, because it would indicate that the only modes that can operate within the volume would have an extremely high frequency (based on the cell thickness of ~5 mm, this would be approximately 30 GHz, which would be far too large to be practical). Such considerations, however, are only valid in the cases where the cell consists of homogeneous conductor-free space.

FIG. 1 shows an example configuration. The battery 20 has terminals 22 and has attached leads 24 on either side of the battery 20. The leads are attached to an electrically insulating coating on the battery and have attached wires 24 for connecting to the circuit (not shown). The leads may be for example, copper tape or metal clamps. The leads may be on opposite sides of the battery or in any location that allows detection of the NMR signal. The wires may be, for example, copper. The battery is incorporated into the circuit shown in FIG. 4 with a parallel tuning capacitor and a series matching capacitor.

By making an electrical or capacitive connection via the pads shown in FIG. 1 on either side of the pouch, the two halves of the cell casing can be driven with a phase shift such as to create constructive interference of the waves within the volume. The presence of conductors inside the volume leads to more degrees of freedom for this model, so that additional modes can propagate within this volume far below the cutoff frequency (Tang et al., "Cutoff-Free Traveling Wave NMR" *Concept. Magn. Reson. A* 38a, 253-267 (2011)). In the field of wireless power delivery both inductive and capacitive approaches have been used to deliver energy across a variety of barriers, although generally at much lower frequencies than those using in this work (Zhang et al., "Wireless Power Transfer—An Overview" *IEEE Trans. Indus. Electronics* 66, 1044-1058 (2019)).

Figure 3:
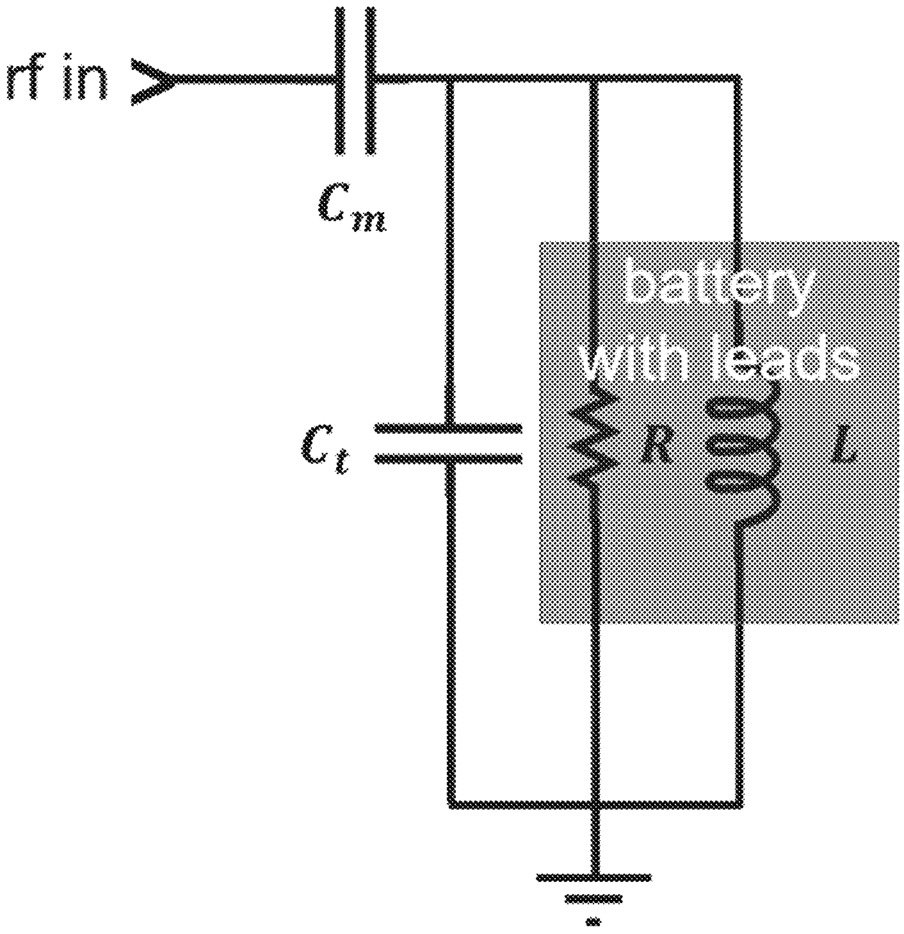
FIG. 3 shows a circuit diagram of a standard series-matched parallel-tuned resonance circuit used in many NMR probes. The shaded box highlights the inductor and effective parallel resistor, those components which are effectively replaced by the battery.

Based on these considerations, suitable tuning conditions for a pouch cell in order to transmit rf at the $^{7}$Li resonance frequency and detect the signal response are identified. NMR probes are typically tuned to the frequency of interest by either series or parallel tuning and matching circuits. Such circuits transform the impedance of the resonant circuit to a specific real resistance (typically 50Ω) for optimal power transmission through a similarly matched transmission line. A generic series-matched parallel-tuned resonant circuit is shown in FIG. 3 (Miller et al., "Interplay among recovery time, signal, and noise: Series- and parallel-tuned circuits are not always the same" *Concept. Magnetic Res.* 12, 125-136 (2000)). The inductor L arises from the rf coil, and the resistor R is the effective Ohmic parallel resistance. Note that R arises originally from the small resistance of the wires of the circuit and the inductor (typically a fraction of 1Ω), and the fairly large resulting effective parallel resistance R (~50-100 kΩ) is a consequence of the transformation by the inductance and capacitance. The unloaded quality factor of this circuit is defined as $Q_0 \equiv R/\omega_0 L$, related to the circuit's recovery time and observed signal size. For the $^{7}$Li resonance frequency of interest, 155 MHz, in this case (at a magnetic field of $B_0$=9.4 T), typical values for a tuned circuit with standard rf coils could be L=0.4 μH and R=50 kΩ. This circuit can be matched to 50Ω by the use of $C_m$ and $C_t$, of 0.65 pF and 1.99 pF, respectively, yielding a quality factor of $Q_0$=128.4. Additional tuning and matching combinations for the simple resonant circuit of FIG. 3 are shown in Table 1.

TABLE 1

Results from impedance calculations for the optimal tuning at 155 MHz for the circuit shown in FIG. 3 as a function of the relevant circuit elements

| L (μH) | R (kΩ) | $C_m$ (pF) | $C_t$ (pF) | Q (loaded) |
|---|---|---|---|---|
| 0.4 | 100 | 0.46 | 2.18 | 128.1 |
| 0.4 | 50 | 0.65 | 1.99 | 63.8 |
| 1.0 | 100 | 0.46 | 0.60 | 51.2 |
| 1.0 | 50 | 0.65 | 0.41 | 25.6 |

As a next step, the strategy for tuning and matching a battery cell that is connected is examined as shown in FIG. 1. In a first approximation, one could consider the cell as represented by the lumped circuit elements as shown in FIG. 3. Such lumped circuit models are often used in electrical impedance spectroscopy (Beard, *Linden's handbook of batteries, 5th edition.* (McGraw-Hill Education, 2019); Barsoukov et al., *Impedance spectroscopy: theory, experiment, and applications.* 2nd edn, (Wiley-Interscience, 2005); Macdonald, *Impedance spectroscopy: emphasizing solid materials and systems.* (Wiley, 1987); Barsoukov et al., *Impedance spectroscopy: theory, experiment, and applications.* Third edition (Wiley, 2018)) to describe how different device components contribute to the overall impedance at a given frequency. These models vary greatly, depending on the frequency ranges examined, but also depending on the level of detail that one wishes to describe with this approach. For this purpose, a "coupling" capacitance $C_1$ that describes the overall capacitance at each pad due to the connection made between the copper tape and the casing material as well as the inner cell compartment is included. Next, a parallel arrangement of some resistance R' and inductance L', to reflect the influence of electrodes, as well as current migration through the electrolyte is incorporated. Note that for the cell under investigation, and for typical pouch cells, one side of the casing is not in full electrical contact with the other due to the nature of the material (polymer-coated Al foil). The capacitance between the two halves is included as the series capacitance $C_2$, which also describes the overall effect of several stacked electrode layers.

Figure 4:
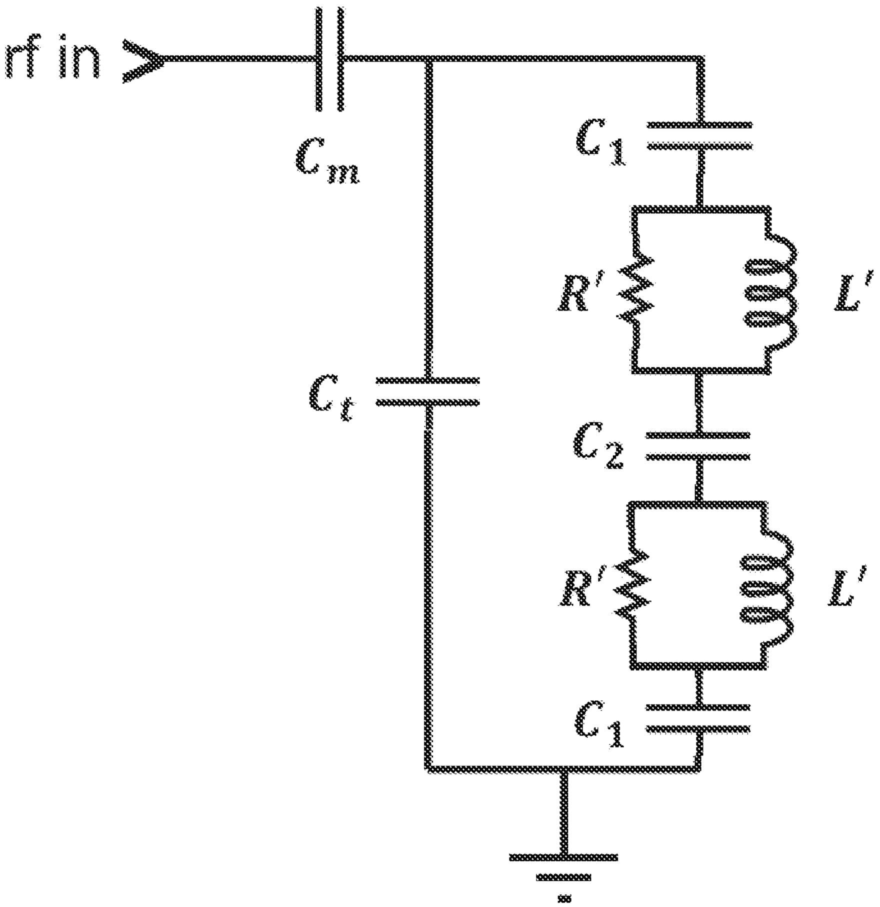
FIG. 4 shows a circuit diagram used in the modeling of the final rf circuit where $C_2$ represents the capacitance between the two aluminum sides of the pouch cell, each of which has an effective R' and L'. $C_1$ represents the capacitance between the copper tape and one side of the aluminum pouch.

Turning to the resonant circuit shown in FIG. 4, similar impedance calculations as for the circuit in FIG. 3 to estimate the values for $C_1$, $C_2$, R', and L' can be employed. Experimentally, it was found that resonant and matching conditions could be reached using $C_m$ and $C_t$ within a range of 0.5 to 4 pF while the loaded Q was in the range of 20-100. With these experimental values, the remaining parameters can be determined. Below are additional analyses allowing the determination of the optimal tuning/matching conditions and to narrow down the range of the parameters. These analyses show, that the circuits in FIGS. 3 and 4 are equivalent for very large $C_1$ and $C_2$, with R'=R/2 and L'=L/2 and $C_1$=$C_2$=5000 (Tables 1 and 2). Given the typical tuning curve shown in FIG. 5 which yields a loaded Q of 29, a curve can be simulated with L'=0.28 μH, R'=25 kΩ, $C_1$=$C_2$=8 pF, $C_m$=2.28 pF, $C_t$=4.00 pF which matches the experimental tuning curve well. $C_m$ and $C_t$ resulting from calculations such as those summarized in Table 2 suggest that $C_1$ and $C_2$ are on the order of 10 pF or larger, slightly above observations. Furthermore, an estimate of $C_1$ can be obtained by considering the area, A, of the copper tape as 2 cm$^2$, and assume the effective distance between the copper tape and the aluminum case to be d=0.1 mm. With the relative permittivity of the medium being 2-3 for the polymer film of the casing. This calculation yields 40-60 pF for $C_1$, which is similar to the value shown in FIG. 5. In summary, using the experimentally determined $C_m$, $C_t$, and Q and estimates of $C_1$ and $C_2$, the simple circuit model of FIG. 4 describes the tuning properties of the circuit and leads to tuning curves which match those experimentally measured.

TABLE 2

Results from impedance calculations of the optimal tuning matching and tuning capacitances, $C_m$ and $C_t$, at 155 MHz for the resonant circuit of FIG. 4 as a function of the values of the other components in these circuits. Italic values mark value pairs, which make circuits in FIGS. 3 and 4 equivalent

| L' (μH) | R' (kΩ) | $C_1$ (pF) | $C_2$ (pF) | $C_m$ (pF) | $C_t$ (pF) | Q (loaded) |
|---|---|---|---|---|---|---|
| 0.2 | 50 | 10 | 10 | 2.21 | 10.41 | 77.4 |
| 0.2 | 50 | 20 | 20 | 0.76 | 3.60 | 102.7 |
| *0.2* | *50* | *5000* | *5000* | *0.46* | *2.18* | *127.9* |
| 0.2 | 25 | 10 | 10 | 3.14 | 9.52 | 38.6 |
| 0.2 | 25 | 20 | 20 | 1.08 | 3.29 | 51.3 |
| *0.2* | *25* | *5000* | *5000* | *0.65* | *1.99* | *63.9* |
| 0.5 | 50 | 10 | 10 | 0.67 | 0.87 | 43.1 |
| 0.5 | 50 | 20 | 20 | 0.55 | 0.71 | 47.1 |
| *0.5* | *50* | *5000* | *5000* | *0.46* | *0.60* | *51.2* |
| 0.5 | 25 | 10 | 10 | 0.95 | 0.59 | 21.5 |

TABLE 2-continued

Results from impedance calculations of the optimal tuning matching and tuning capacitances, $C_m$ and $C_t$, at 155 MHz for the resonant circuit of FIG. 4 as a function of the values of the other components in these circuits. Italic values mark value pairs, which make circuits in FIGS. 3 and 4 equivalent

| L' (μH) | R' (kΩ) | $C_1$ (pF) | $C_2$ (pF) | $C_m$ (pF) | $C_t$ (pF) | Q (loaded) |
|---|---|---|---|---|---|---|
| 0.5 | 25 | 20 | 20 | 0.77 | 0.48 | 23.5 |
| *0.5* | *25* | *5000* | *5000* | *0.65* | *0.41* | *25.6* |

Figure 2:
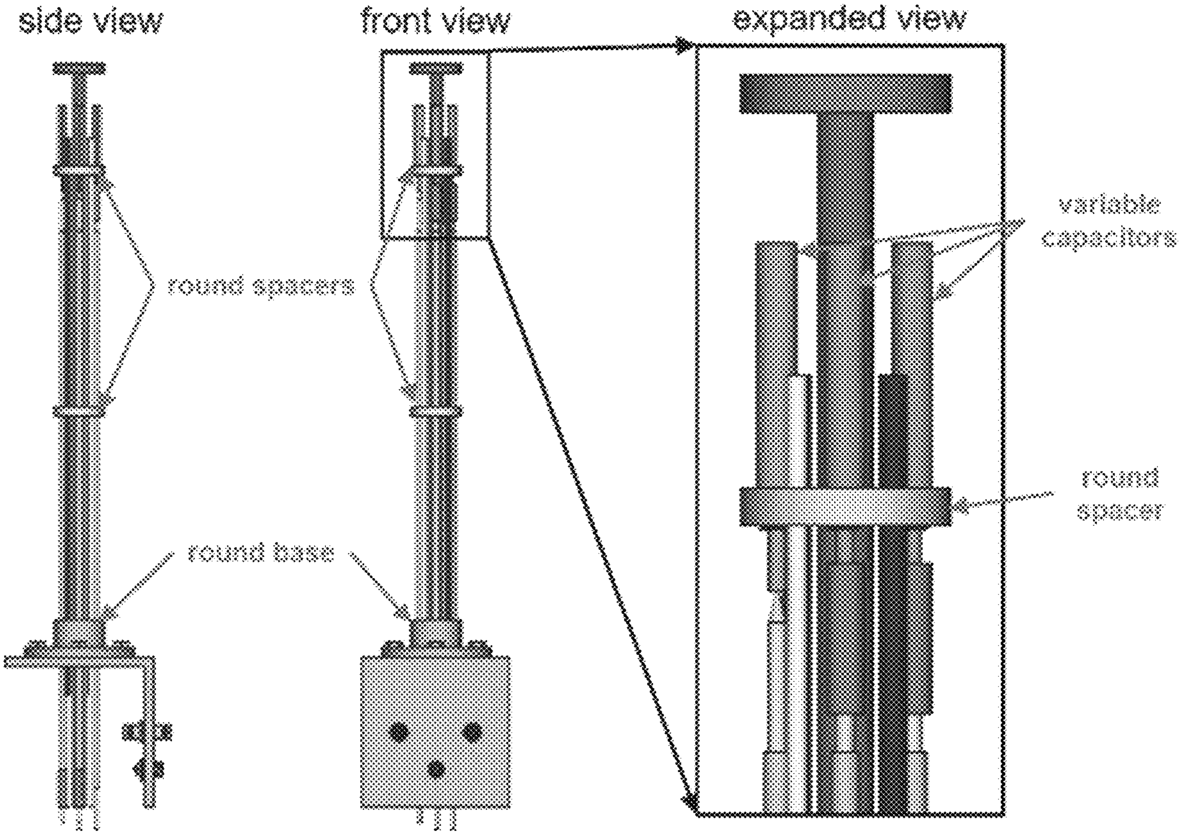
FIG. 2 shows a schematic of a probe for this setup.

To incorporate the battery cell into the resonant circuit, a simple NMR probe was designed and constructed. It is compatible with a Bruker Ultrashield 9.4 T Avance I spectrometer containing a Bruker Micro2.5 gradient assembly with an inner diameter of 40 mm. The layout of the probe was optimized for future flexibility, e.g., the ability to incorporate up to four high-voltage variable capacitors for multiple-tuning and a large flexibility in sample geometry. Additionally, tubes were incorporated for frame cooling, electrical connections and a middle tube for additional accessory items. Every effort was made to use readily available parts, e.g., tubing with non-metric diameters. The drawings for the probe are shown in FIG. 2. The battery is placed at the top of this probe with the wires connected to the variable capacitors.

The NMR parameters used in these experiments are given in Table 3. For the spin echo experiments, a 16-step phase cycle was employed ($\phi_1$=x, y, −x, −y, x, y, −x, −y, x, y, −x, −y, x, y, −x, −y; $\phi_2$=x, x, x, x, y, y, y, y, −x, −x, −x, −x, −y, −y, −y, −y; $\phi_{rec}$=x, −y, −x, y, −x, y, x, −y, x, −y, −x, y, −x, y, x, −y). It was difficult to obtain accurate estimates of the optimal pulse lengths in the spin echo experiments due to the large inhomogeneity of the internal rf fields. The pulse lengths used were chosen based on an estimation extracted from a series of single-pulse experiments. The pulse may be, for example, 10-1000 μs. The response signal is detected as an rf voltage, which is Fourier transformed to generate the NMR spectrum.

TABLE 3

NMR parameters used

| Experiment | Recycle delay | Echo time | Pulse 1 | Pulse 2 | Number of Averages | Transmitter frequency |
|---|---|---|---|---|---|---|
| Metal | 0.4 s | 1.1 ms | 337 μs @ ~240 W | 674 μs @ ~240 W | 40960 | 155.5488 MHz |
| Electrolyte | 1/2/0.75 s | 1.1 ms | 337 μs @ ~240 W | 674 μs @ ~240 W | 32768/32768/ 81920 | 155.5100 MHz |
| Reference | 0.4 s | n.a. | 16 μs | | 1536 | 155.5482 MHz |

The actual dimensions of the pouch cell battery used in this work were approximately 40 mm×30 mm×5 mm). The cell was a PowerStream (Utah, US) jelly rolled lithium ion battery with 600 mAh capacity. The graphite and NMC electrodes are rolled in twelve active layers and packed inside an aluminum pouch case. The battery is made from graphite anode, aluminum, and copper current collectors. The cathode is made of Co (44.76), O (33.20), Ni (4.79), and Mn (2.99). It was cycled using a current of 300 mA (a charge/discharge rate of 0.5 C) several times before integrating it into the circuit.

Contacts between the pads and the cell were improved by using fine sandpaper to remove some of the polymer coating on each face of the pouch cell while avoiding puncturing the very thin aluminum metal casing. This step may not be needed since the resonating conditions are based on capacitive coupling.

Figure 5:
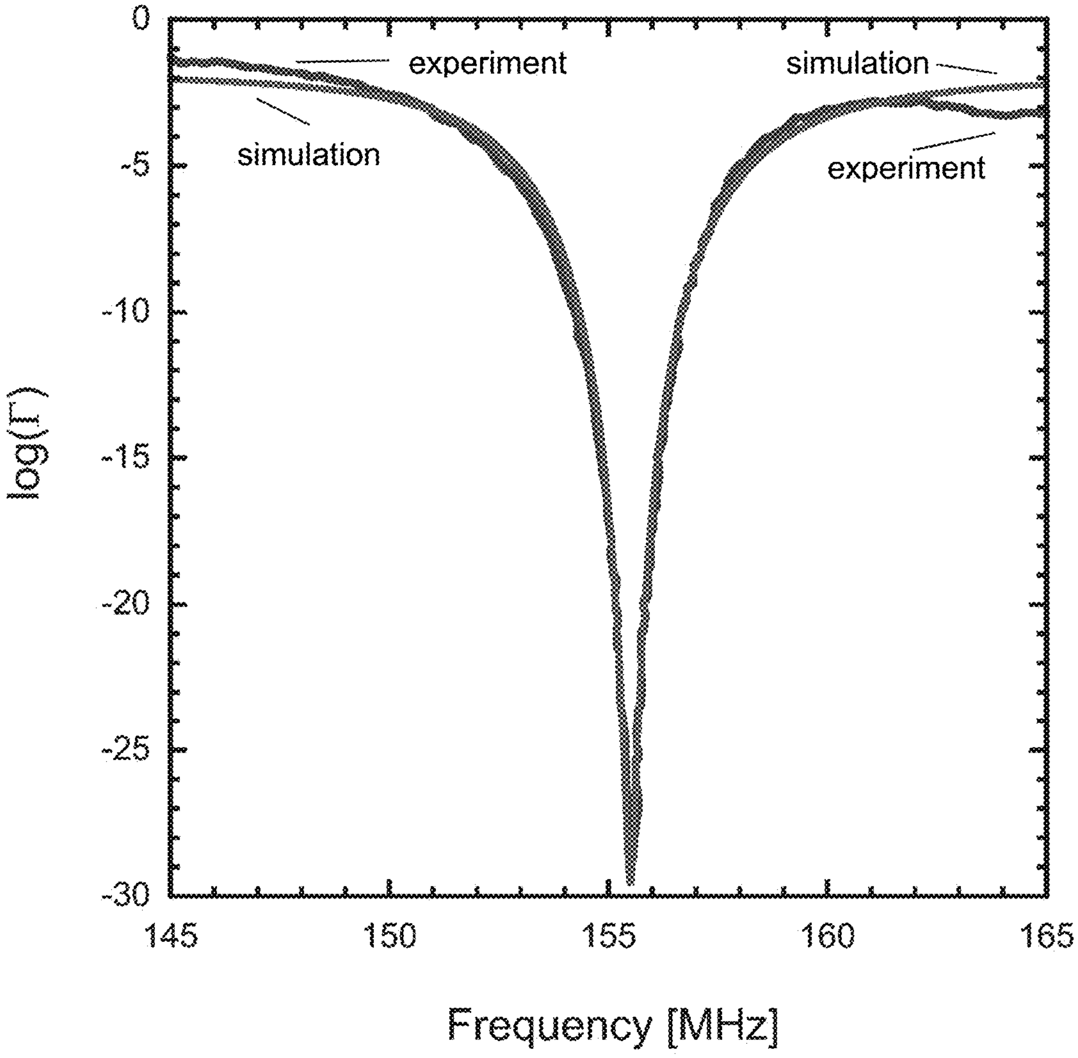
FIG. 5 shows a plot of an experimental tuning curve obtained for the battery-as-coil circuit along with a tuning curve calculated using the model circuit of FIG. 4 and the equations described below. The loaded Q, as determined by the width of the tuning minimum was 29. The parameters used in the calculation were: L'=0.42 μH, R'=25 kΩ, $C_1$=$C_2$=40 pF, $C_m$=0.74 pF, $C_t$=0.63 pF.
Figure 6:
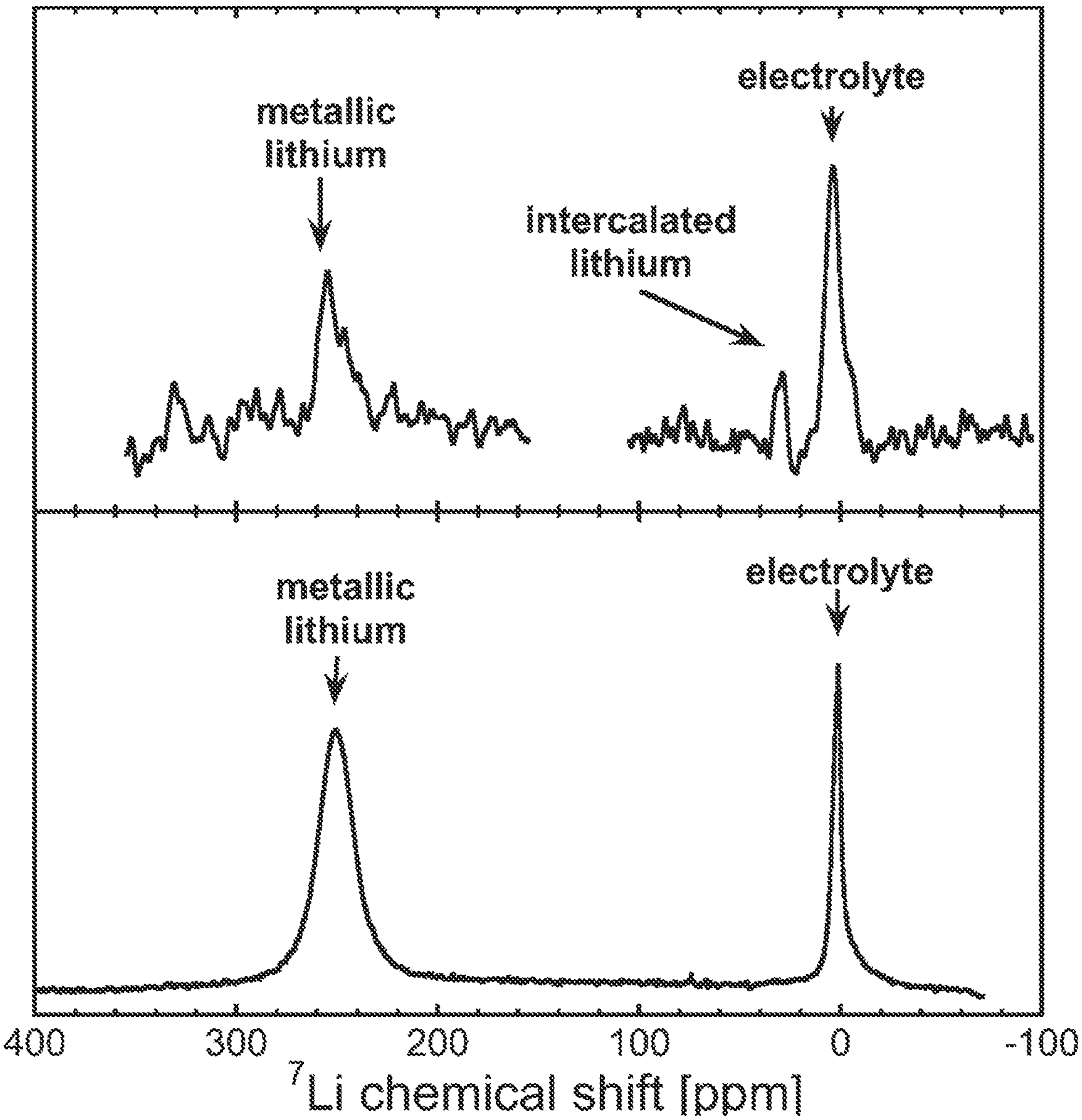
FIG. 6 shows $^7$Li NMR spectra obtained for the battery-as-coil setup using a Hahn echo preparation (top) and for a reference battery cell using a traditional solenoid coil and single pulse acquisition (bottom). The top spectra were obtained from two separate measurements, one where the spectrometer frequency was at 255 ppm (left) and one where the spectrometer frequency was 5 ppm (right).
Figure 7:
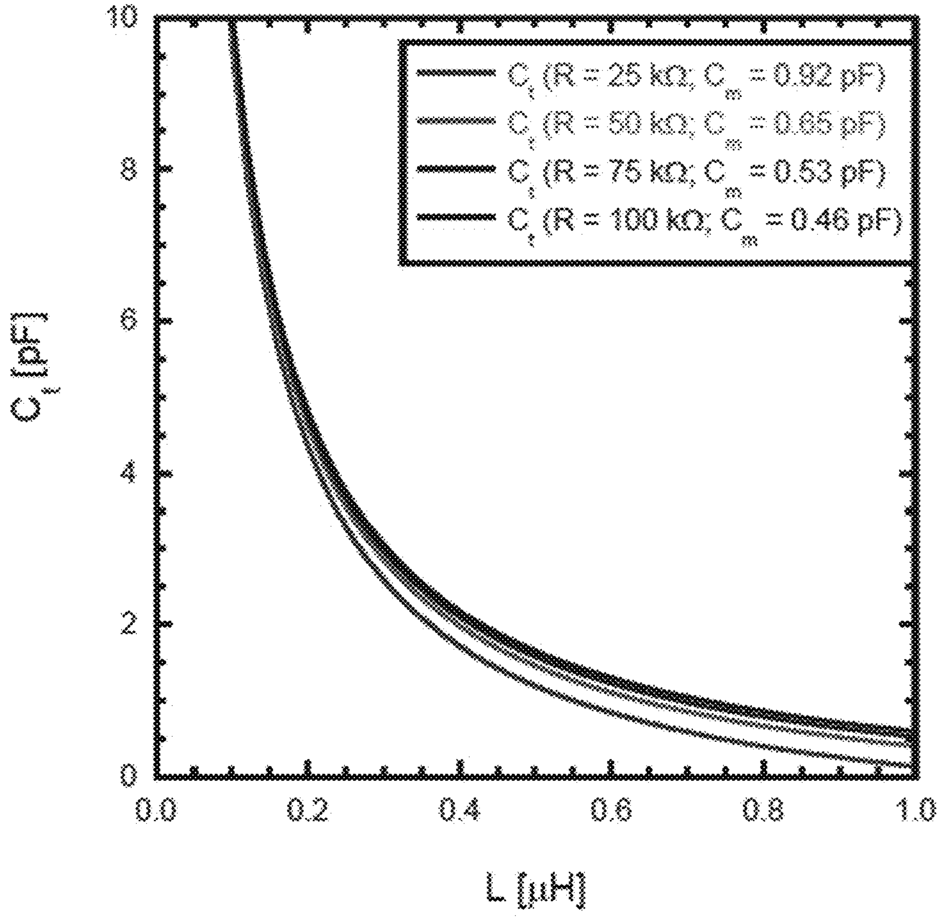
FIG. 7 shows a plot of the calculated optimal tuning capacitance, $C_t$, of the normal circuit as a function of the inductance, L, of the coil for a range of effective parallel resistances, R; Note that the matching capacitance is determined solely by R and $R_0$ (50Ω)—see Eq. 10.
Figure 8:
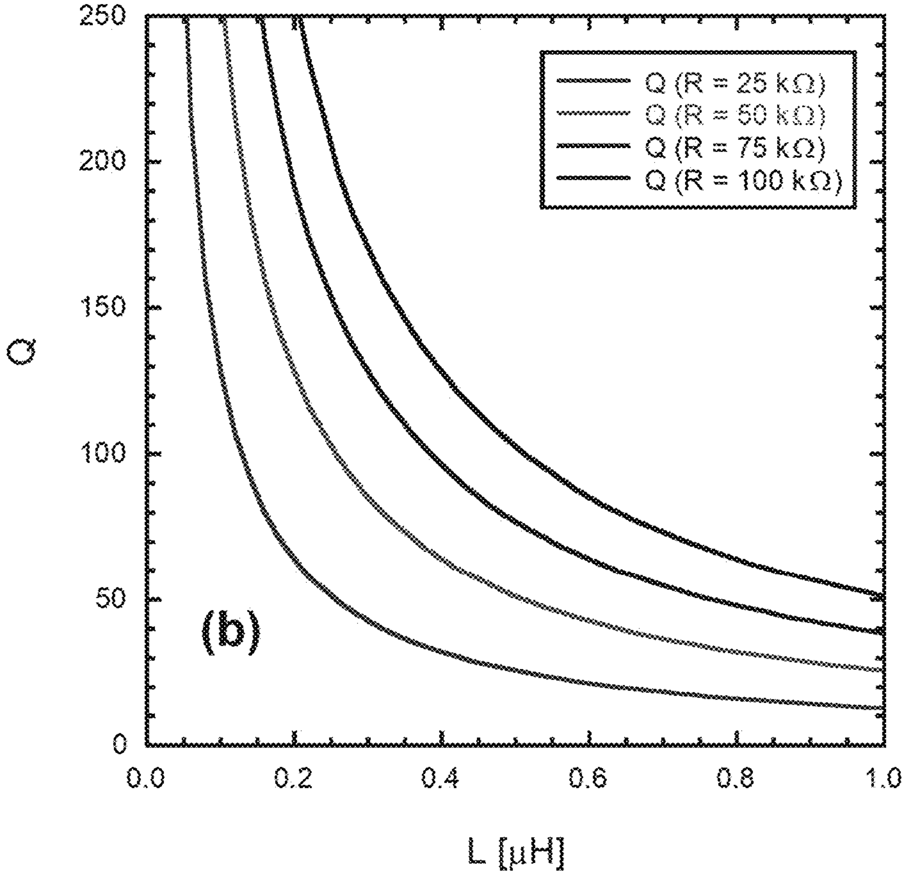
FIG. 8 shows a plot of the loaded Q of the normal circuit as a function of the inductance, L, of the coil for a range of effective parallel resistances, R. The loaded Q was found from direct calculations of the impedance as a function of frequency and quantitatively agrees with $Q=Q_0/2=R(2\omega_0 L)$.
Figure 9:
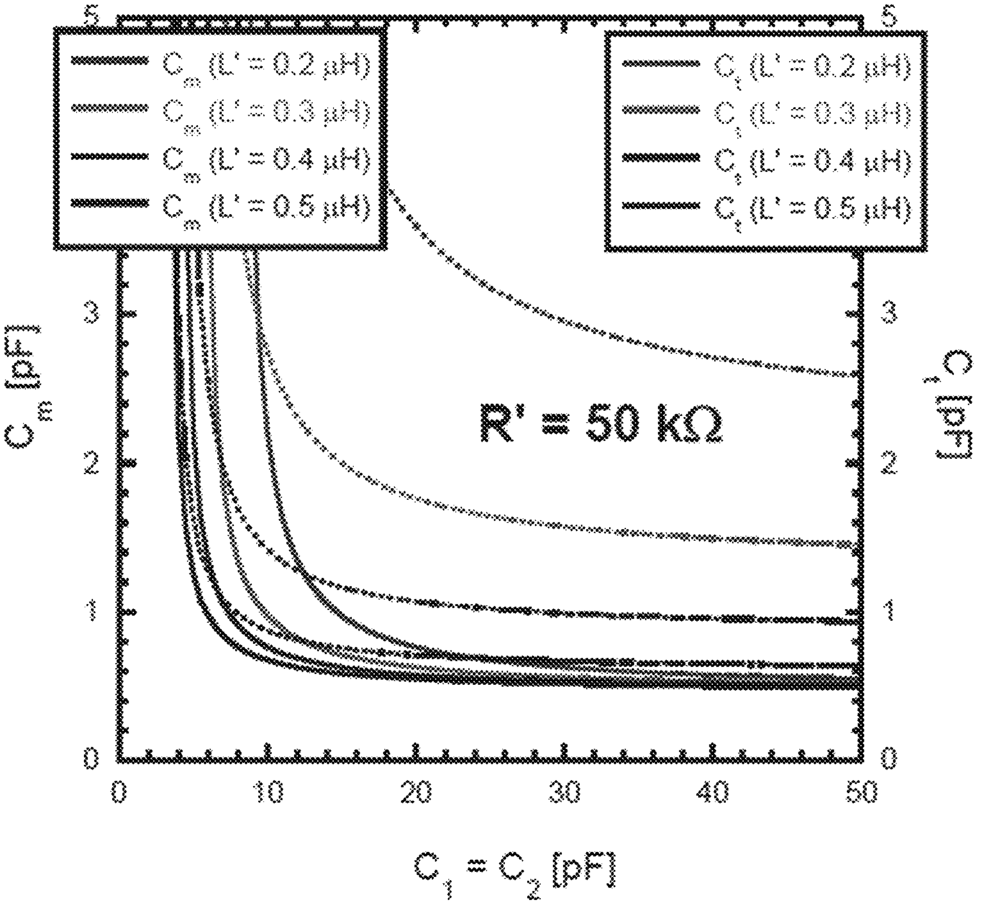
FIG. 9 shows a plot, for $C_1$=$C_2$, of the calculated optimal tuning capacitance, $C_t$, and matching capacitance, $C_m$, of the battery-as-coil circuit as a function of the two capacitances, $C_1$ and $C_2$, for a range of inductances, L', and an effective parallel resistance, R', of 50 kΩ.
Figure 10:
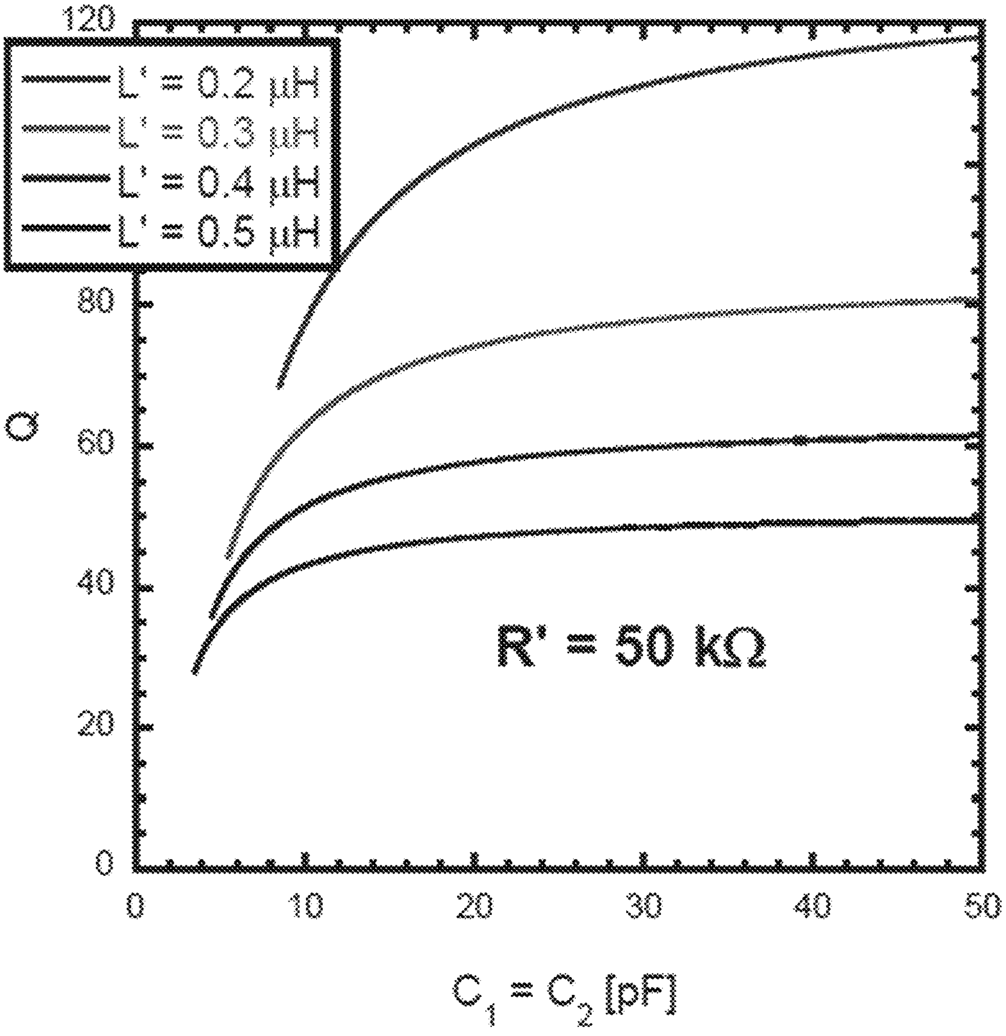
FIG. 10 shows a plot, for $C_1$=$C_2$, of the loaded Q of the circuit as a function of the two capacitances, $C_1$ and $C_2$. The loaded Q was found from direct calculations of the impedance as a function of frequency.
Figure 11:
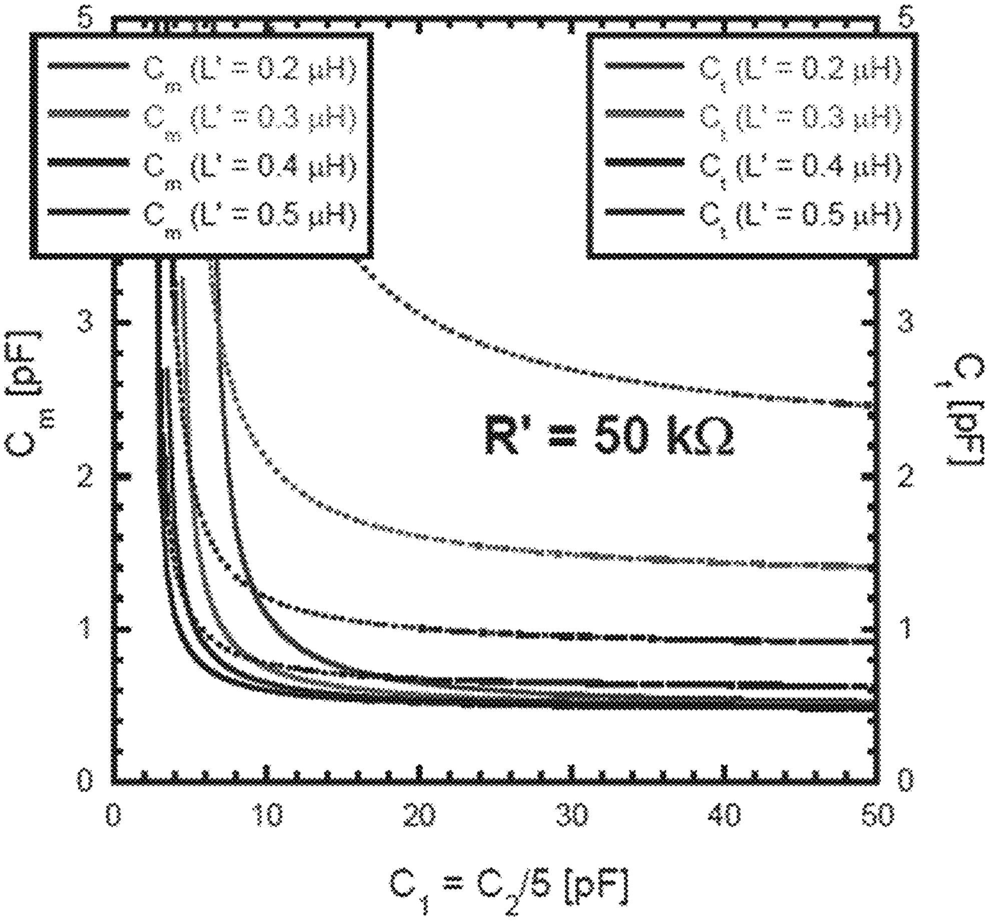
FIG. 11 shows a plot, for $C_1$=$C_2$/5, of the calculated optimal tuning capacitance, $C_t$, and matching capacitance, $C_m$, of the battery-as-coil circuit as a function of the two capacitances, $C_1$ and $C_2$, for a range of inductances, L', and an effective parallel resistance, R', of 50 kΩ.
Figure 12:
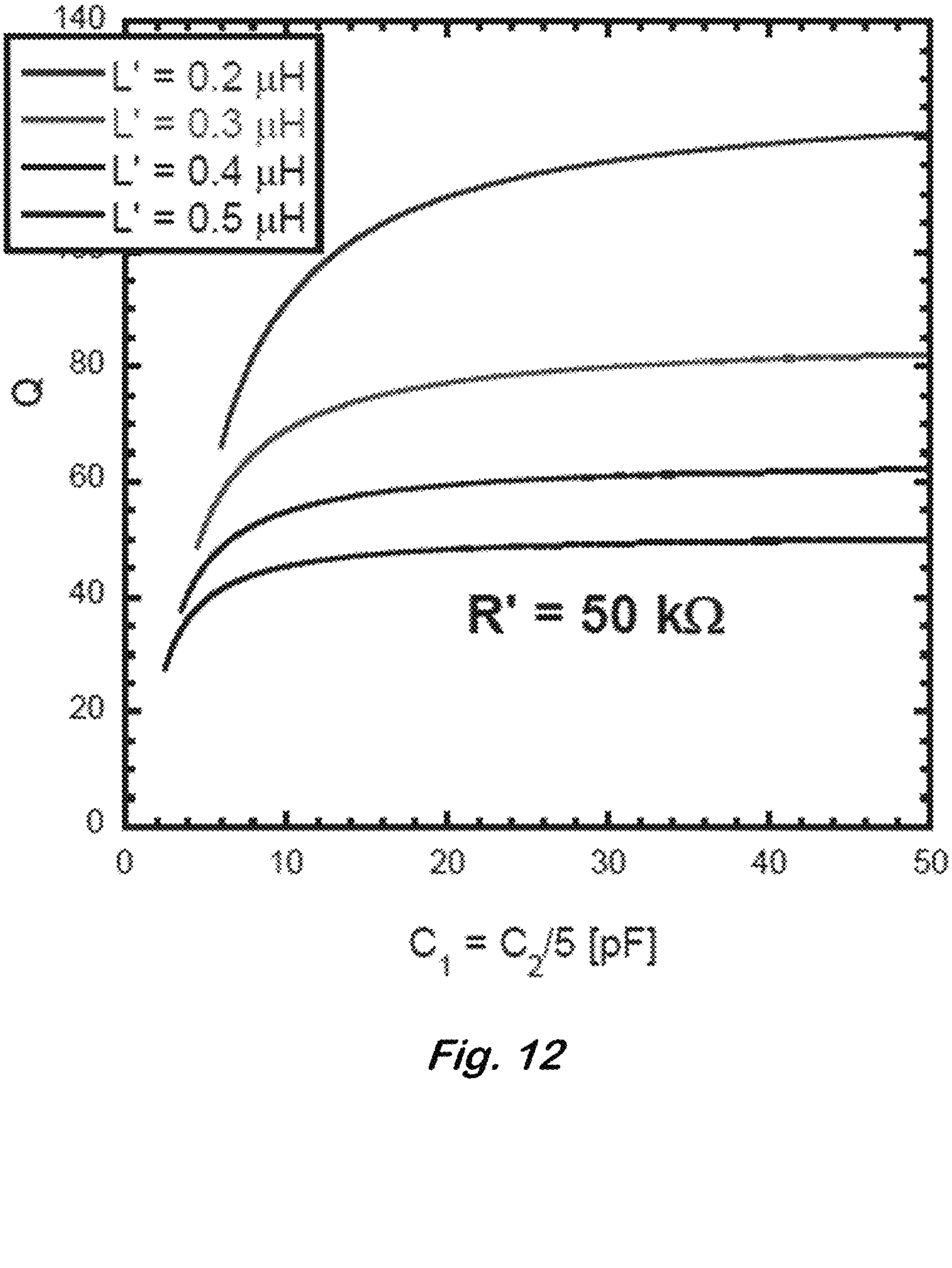
FIG. 12 shows a plot, for $C_1$=$C_2$/5, of the loaded Q of the circuit as a function of the two capacitances, $C_1$ and $C_2$. The loaded Q was found from direct calculations of the impedance as a function of frequency.
Figure 13:
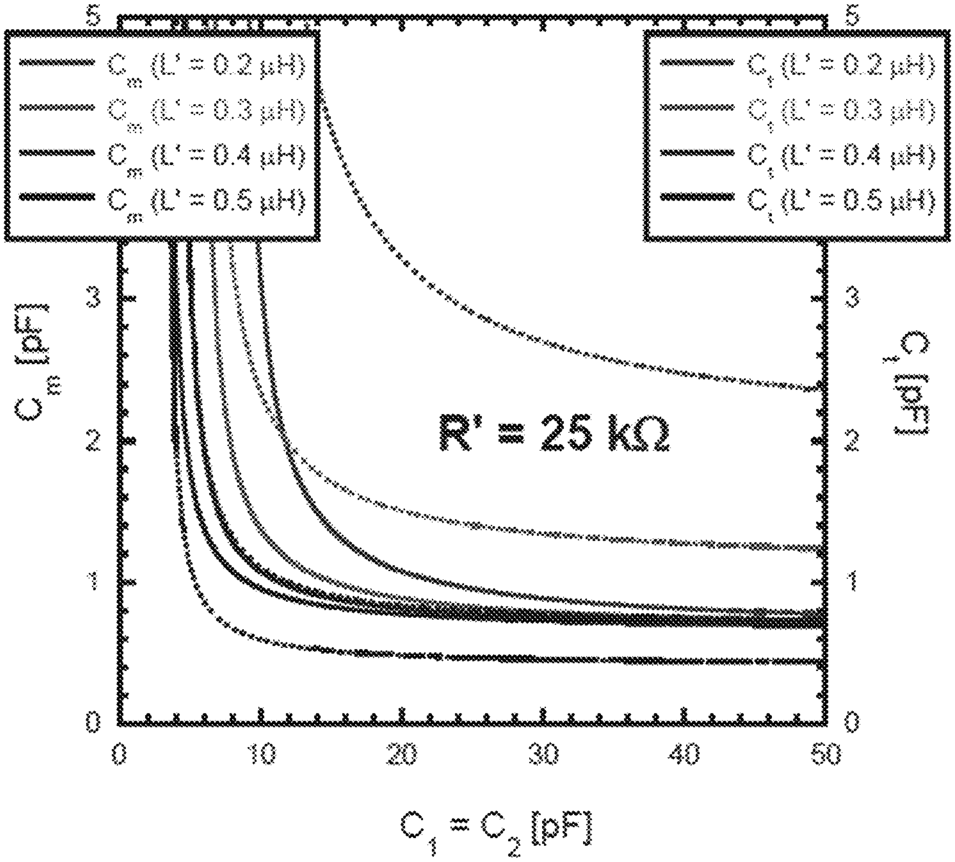
FIG. 13 shows a plot, for $C_1$=$C_2$, of the calculated optimal tuning capacitance, $C_t$, and matching capacitance, $C_m$, of the battery-as-coil circuit as a function of the two capacitances, $C_1$ and $C_2$, for a range of inductances, L', and an effective parallel resistance, R', of 25 kΩ.
Figure 14:
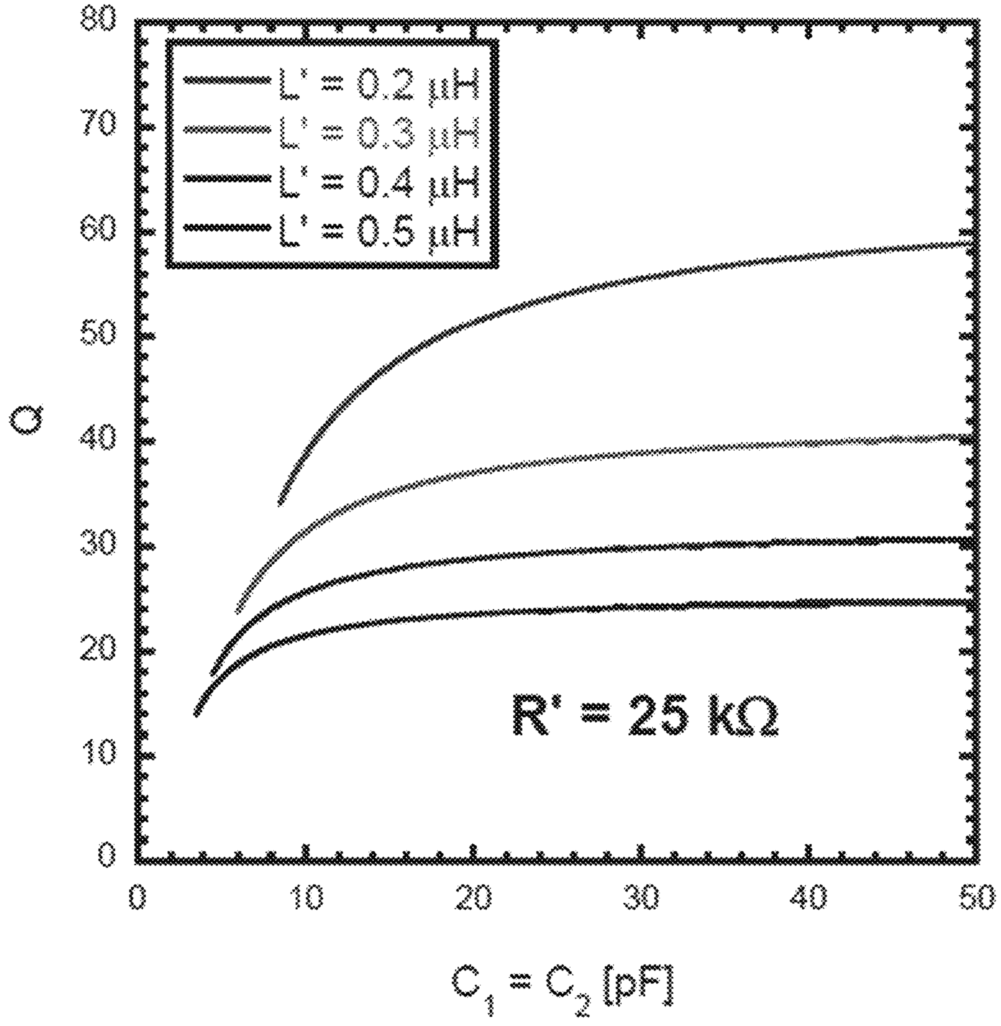
FIG. 14 shows a plot, for $C_1$=$C_2$, of the loaded Q of the circuit as a function of the two capacitances, $C_1$ and $C_2$. The loaded Q was found from direct calculations of the impedance as a function of frequency.
Figure 15:
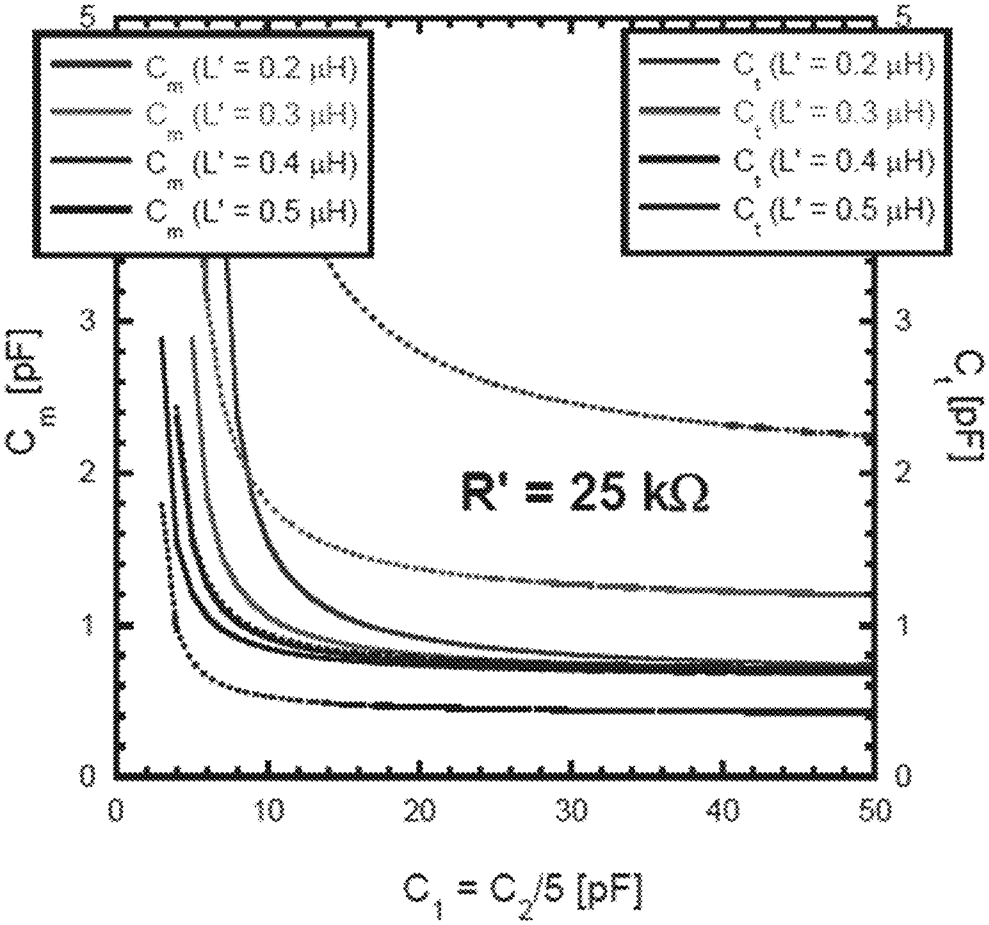
FIG. 15 shows a plot, for $C_1$=$C_2$/5, of the calculated optimal tuning capacitance, $C_t$, and matching capacitance, $C_m$, of the battery-as-coil circuit as a function of the two capacitances, $C_1$ and $C_2$, for a range of inductances, L', and an effective parallel resistance, R', of 25 kΩ.
Figure 16:
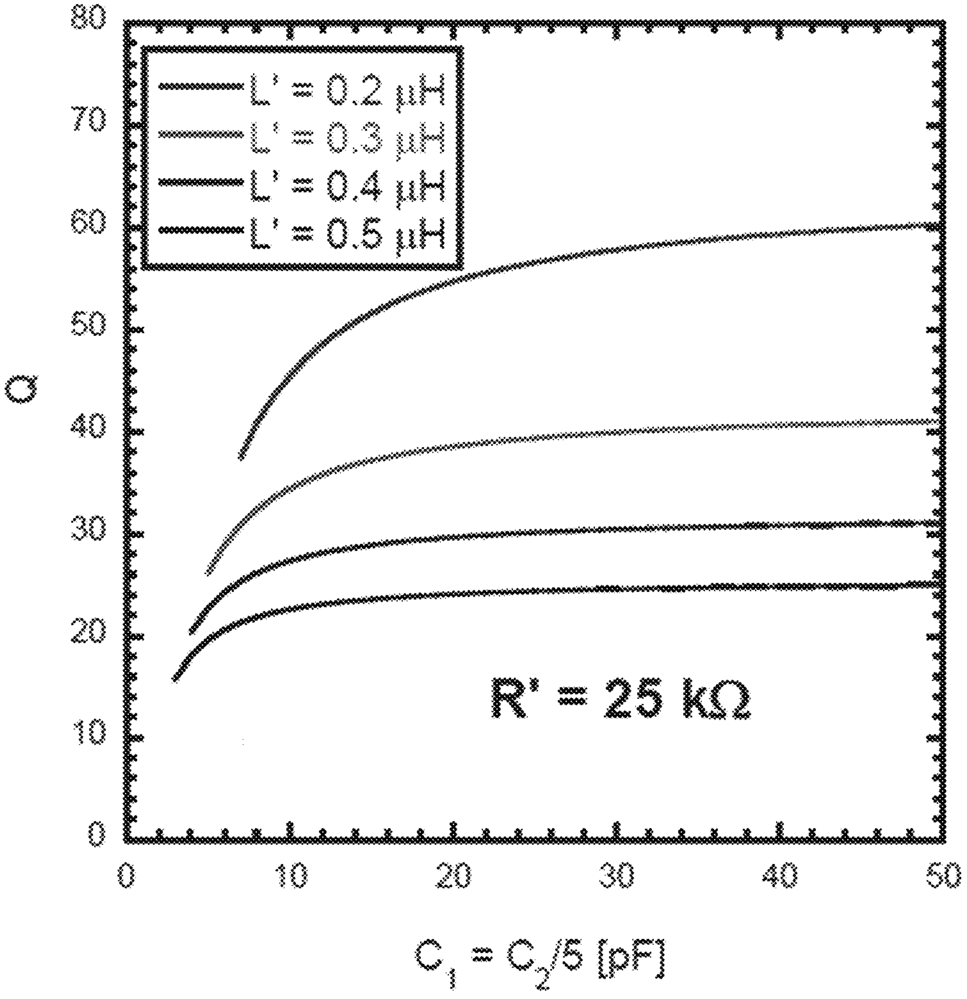
FIG. 16 shows a plot, for $C_1$=$C_2$/5, of the loaded Q of the circuit as a function of the two capacitances, $C_1$ and $C_2$. The loaded Q was found from direct calculations of the impedance as a function of frequency.

FIG. 5 shows the NMR spectra obtained from the cell with this setup. The spectra display clear evidence of the characteristic signals of electrolyte (ionic) lithium (near 0 ppm), metallic lithium (near 260 ppm), and lithium intercalated into graphite (near 30 ppm). Background $^7$Li signals in the probe can be neglected and therefore the observation of a signal at 155.5 MHz indicates that signal from within the pouch cell battery is obtained. (The nearest NMR resonance frequencies are $^{31}$P at 162.0 MHz, $^{119}$Sn at 149.2 MHz, $^{117}$Sn at 142.5 MHz.) Furthermore, signals from probe ringing can be ruled out because the spectra were acquired using Hahn echoes with sufficient echo times and phase cycles that would eliminate the signatures of ringing.

The assignment of the signals is further corroborated by comparing the spectra to those obtained using a solenoid coil with a reference lithium metal cell. A very good correspondence between the shifts observed for electrolyte $^7$Li, near 0 ppm, and metallic lithium, near 260 ppm, is found here.

The detection of all these components is of great interest in battery research. The quantification and localization of electrolyte lithium is relevant for the study of electrolyte gradients, the assessment of electrolyte degradation, leakage, and proper distribution. The detection of intercalated lithium is relevant for the quantification of anodic energy storage. The quantification of metallic lithium is characteristic for the buildup of lithium microstructure, including lithium dendrites, which is often a degradative process in cells, and indicates the onset of failure modes (Beard, *Linden's handbook of batteries, 5th edition.* (McGraw-Hill Education, 2019)). It is interesting to observe that these metallic lithium signals could be detected in a commercial cell with a graphitic anode. In such cells metallic lithium would only ever occur in such a cell following a degradative process. For example, this process may be a consequence of overcharging or fast charging.

It is shown here that it is possible to allow rf irradiation to penetrate into the inside compartment of Li-ion battery cells, excite and detect NMR signals, and record NMR spectra. The key to the success of this approach was the incorporation of the cell directly into the tuned rf circuit via capacitive coupling. Placing the capacitively coupled pads on either side of the cell allows driving the casing with a phase difference and thus to generate the requisite oscillating magnetic field inside. While in the initial experiment the absolution magnitude of these internal fields is small and there is evidence for significant inhomogeneity, it was possible to obtain a $^7$Li NMR spectrum of the three most important lithium environments in a cell: $^7$Li in the electrolyte, graphite-intercalated lithium, and metallic lithium. These three environments reflect critical device parameters, which could be monitored nondestructively over time and at different stages of a battery's life cycle.

Here is derived the simple equations used to generate plots of the tuning and matching capacitance for the two circuits shown in FIGS. 3 and 4 as a function of the impedance of other circuit components. For the typical series-matched parallel-tuned circuit shown in FIG. 2*a* we can write an expression for the impedance as:

$$Z_p = \frac{1}{Z_{C_m}} + \left(\frac{1}{Z_{C_t}} + \frac{1}{Z_L} + \frac{1}{R}\right)^{-1} = -\frac{j}{\omega C_m} + \left(j\omega C_t + \frac{j}{\omega L} + \frac{1}{R}\right)^{-1} \quad \text{Eq. 1}$$

Tuning the circuit involves finding $C_m$ and $C_t$ so that $Z_p=50\Omega$, i.e., $Re(Z_p)=R_0=50\Omega$ and $Im(Z_p)=0\Omega$. Returning to Eq. 1.

$$Z_p = -\frac{j}{\omega C_m} + \left(\frac{1}{\frac{1}{R} + j\left(\omega C_t - \frac{1}{\omega L}\right)}\right) = -\frac{j}{\omega C_m} + \left(\frac{\frac{1}{R} - j\left(\omega C_t - \frac{1}{\omega L}\right)}{\frac{1}{R^2} + \left(\omega C_t - \frac{1}{\omega L}\right)^2}\right) \quad \text{Eq. 2}$$

$$R_0 = \left(\frac{1}{\frac{1}{R^2} + \left(\omega C_t - \frac{1}{\omega L}\right)^2}\right) \quad \text{Eq. 3}$$

$$\frac{1}{\omega C_m} = -\left(\frac{\left(\omega C_t - \frac{1}{\omega L}\right)}{\frac{1}{R^2} + \left(\omega C_t - \frac{1}{\omega L}\right)^2}\right) \quad \text{Eq. 4}$$

Use Eq. 3 to solve for $C_t$.

$$\left(\omega C_t - \frac{1}{\omega L}\right)^2 = \frac{1}{RR_0} - \frac{1}{R^2} = \frac{R - R_0}{R^2 R_0} \quad \text{Eq. 5}$$

$$\left(\omega C_t - \frac{1}{\omega L}\right) = \pm\frac{1}{R}\sqrt{\frac{R}{R_0} - 1} \quad \text{Eq. 6}$$

$$C_t = \frac{1}{\omega^2 L}\left(1 \pm \frac{\omega L}{R}\sqrt{\frac{R}{R_0} - 1}\right) \quad \text{Eq. 7}$$

Having $C_t$, use Eq. 4 to obtain $C_m$.

$$C_m = -\frac{1}{\omega}\left(\frac{\frac{1}{R^2} + \left(\omega C_t - \frac{1}{\omega L}\right)^2}{\left(\omega C_t - \frac{1}{\omega L}\right)}\right) \quad \text{Eq. 8}$$

Note that one can use Eq. 5 and Eq. 6 to simplify Eq. 8.

$$C_m = -\frac{1}{\omega}\left(\frac{\frac{1}{RR_0}}{\pm\frac{1}{R}\sqrt{\frac{R}{R_0} - 1}}\right) \quad \text{Eq. 9}$$

$$C_m = -\frac{1}{\omega}\left(\pm\sqrt{R_0(R - R_0)}\right)^{-1} \quad \text{Eq. 10}$$

This agrees with Miller et al., Interplay among recovery time, signal, and noise: Series- and parallel-tuned circuits are not always the same. Concepts in Magnetic Resonance, 2000. 12(3): p. 125-136.

Apply a similar approach to the battery circuit shown in FIG. 4 starting with the equation for the total impedance $$Z_b = Z_{C_m} + \left(\frac{1}{Z_{C_t}} + \frac{1}{2Z_{C_1} + Z_{C_2} + 2\left(\frac{1}{Z_{L'}} + \frac{1}{Z_{R'}}\right)^{-1}}\right)^{-1} \quad \text{Eq. 11}$$

$$Z_b = -\frac{j}{\omega C_m} + \left(j\omega C_t + \frac{1}{-\frac{2j}{\omega C_1} - \frac{j}{\omega C_2} + 2\left(-\frac{j}{\omega L'} + \frac{1}{R'}\right)^{-1}}\right)^{-1} \quad \text{Eq. 12}$$

$$Z_b = -\frac{j}{\omega C_m} + \left(j\omega C_t + \frac{1}{-\frac{2j}{\omega C_1} - \frac{j}{\omega C_2} + 2\left(\frac{\omega L' R'}{\omega L' - jR'}\right)}\right)^{-1} \quad \text{Eq. 13}$$

$$Z_b = -\frac{j}{\omega C_m} + \left(j\omega C_t + \frac{1}{-\frac{2j}{\omega C_1} - \frac{j}{\omega C_2} + 2\left(\frac{\omega L' R'^{(\omega L' + jR')}}{\omega^2 (L')^2 + (R')^2}\right)}\right)^{-1} \quad \text{Eq. 14}$$

$$Z_b = -\frac{j}{\omega C_m} + \left(j\omega C_t + \frac{1}{\frac{2\omega^2 (L')^2 R'}{\omega^2 (L')^2 + (R')^2} + j\left(\frac{2\omega L' (R')^2}{\omega^2 (L')^2 + (R')^2} - \frac{2j}{\omega C_1} - \frac{j}{\omega C_2}\right)}\right)^{-1} \quad \text{Eq. 15}$$

Note that in the limit $C_1$, $C_2 \rightarrow \infty$, Eq. 12 becomes $$Z_b = -\frac{j}{\omega C_m} + \left(j\omega C_t - j\frac{1}{2\omega L'} + \frac{1}{2R'}\right)^{-1} \quad \text{Eq. 16}$$

which is the same as Eq. 1 when 2L'=L and 2R'=R.

Returning to Eq. 15 and using the substitutions:

$$A = \frac{2\omega^2 (L')^2 R'}{\omega^2 (L')^2 + (R')^2} \quad \text{Eq. 17}$$

$$B = \frac{2\omega L' (R')^2}{\omega^2 (L')^2 + (R')^2} - \frac{2j}{\omega C_1} - \frac{j}{\omega C_2} \quad \text{Eq. 18}$$

rewrite Eq. 15 as $$Z_b = -\frac{j}{\omega C_m} + \left(j\omega C_t + \frac{1}{A + jB}\right)^{-1} \quad \text{Eq. 19}$$

$$Z_b = -\frac{j}{\omega C_m} + \left(j\omega C_t + \frac{A - jB}{A^2 + B^2}\right)^{-1} \quad \text{Eq. 20}$$

$$Z_b = -\frac{j}{\omega C_m} + \left(\frac{A^2 + B^2}{j\omega C_t(A^2 + B^2) + A - jB}\right) \quad \text{Eq. 21}$$

$$Z_b = -\frac{j}{\omega C_m} + \left(\frac{(A^2 + B^2)[A + j(B - \omega C_t(A^2 + B^2))]}{(B - \omega C_t(A^2 + B^2))^2 + A^2}\right) \quad \text{Eq. 22}$$

Remembered that at tuning $Z_b=R_0$, now write $$R_0 = \frac{(A^2 + B^2)A}{(B - \omega C_t(A^2 + B^2))^2 + A^2} \quad \text{Eq. 23}$$

Now solve for $C_t$ in steps.

$$\left(B-\omega C_t\left(A^2+B^2\right)\right)^2=\frac{\left(A^2+B^2\right)A}{R_0}-A^2 \qquad \text{Eq. 24}$$

$$B-\omega C_t\left(A^2+B^2\right)=\pm\sqrt{\frac{\left(A^2+B^2\right)A}{R_0}-A^2} \qquad \text{Eq. 25}$$

$$C_t=\frac{1}{\omega\left(A^2+B^2\right)}\left[B\pm\sqrt{\frac{\left(A^2+B^2\right)A}{R_0}-A^2}\right] \qquad \text{Eq. 26}$$

Using the fact that $Z_b$ is pure real at tuning allows $$\frac{1}{\omega C_m}=\frac{\left(A^2+B^2\right)\left(B-\omega C_t\left(A^2+B^2\right)\right)}{\left(B-\omega C_t\left(A^2+B^2\right)\right)^2+A^2} \qquad \text{Eq. 27}$$

$$C_m=\frac{1}{\omega}\left(\frac{\left(B-\omega C_t\left(A^2+B^2\right)\right)^2+A^2}{\left(A^2+B^2\right)\left(B-\omega C_t\left(A^2+B^2\right)\right)}\right) \qquad \text{Eq. 28}$$

Note that in the limit $C_1, C_2 \rightarrow \infty$ $$A=\frac{2\omega^2(L')^2R'}{\omega^2(L')^2+(R')^2} \qquad \text{Eq. 29}$$

$$B=\frac{2\omega L'(R')^2}{\omega^2(L')^2+(R')^2}=\left(\frac{R'}{\omega L'}\right)A \qquad \text{Eq. 30}$$

$$A^2+B^2=\frac{(2\omega L'R')^2\left(\omega^2(L')^2+(R')^2\right)}{\left(\omega^2(L')^2+(R')^2\right)^2}=\frac{(2\omega L'R')^2}{\omega^2(L')^2+(R')^2} \qquad \text{Eq. 31}$$

$$R_0=\frac{\left(A^2+B^2\right)A}{\left(B-\omega C_t\left(A^2+B^2\right)\right)^2+A^2} \qquad \text{Eq. 32}$$

$$R_0=\frac{\left(A^2+B^2\right)A}{A^2+B^2-2\omega C_tB\left(A^2+B^2\right)+\left(\omega C_t\left(A^2+B^2\right)\right)^2} \qquad \text{Eq. 33}$$

$$R_0=\frac{A}{1-2\omega C_tB+\omega^2C_t^2\left(A^2+B^2\right)} \qquad \text{Eq. 34}$$

Focusing on the denominator:

$$1-2\omega C_tB+\omega^2C_t^2\left(A^2+B^2\right)=\frac{\omega^2(L')^2+(R')^2-2\omega C_t2\omega L'(R')^2+\omega^2C_t^2(2\omega L'R')^2}{\omega^2(L')^2+(R')^2} \qquad \text{Eq. 35}$$

$$1-2\omega C_tB+\omega^2C_t^2\left(A^2+B^2\right)=\frac{\omega^2(L')^2+\left(2\omega^2C_tL'R'-R'\right)^2}{\omega^2(L')^2+(R')^2} \qquad \text{Eq. 36}$$

$$1-2\omega C_tB+\omega^2C_t^2\left(A^2+B^2\right)=\frac{\omega^2(L')^2+(R')^2-(2\omega L'R')^2\left(\omega C_t-\frac{1}{2\omega L'}\right)^2}{\omega^2(L')^2+(R')^2} \qquad \text{Eq. 37}$$

Now back to $R_0$ $$R_0=\frac{2\omega^2(L')^2R'}{\omega^2(L')^2+(2\omega L'R')^2\left(\omega C_t-\frac{1}{2\omega L'}\right)^2} \qquad \text{Eq. 38}$$

$$R_0=\frac{2R'}{1+(2R')^2\left(\omega C_t-\frac{1}{2\omega L'}\right)^2} \qquad \text{Eq. 39}$$

$$R_0=\frac{\frac{1}{2R'}}{\frac{1}{(2R')^2}+\left(\omega C_t-\frac{1}{2\omega L'}\right)^2} \qquad \text{Eq. 40}$$

This is the same as Eq. 3 with 2R'=R.

Eqs. 7 and 8 can now be used for the normal circuit and Eqs. 26 and 28 for the battery circuit to make plots shown in FIGS. 7-16. By calculating the impedance as a function of frequency, the loaded Q for the circuits can be determined.

Obviously, many modifications and variations are possible in light of the above teachings. It is therefore to be understood that the claimed subject matter may be practiced otherwise than as specifically described. Any reference to claim elements in the singular, e.g., using the articles "a", "an", "the", or "said" is not construed as limiting the element to the singular.

What is claimed is:

1. A method comprising:

providing a circuit comprising:

a rechargeable pouch cell battery comprising lithium and an electrically insulating coating on the outside of the battery;

a first electrical lead entirely outside the battery and in contact with the coating at a first location on the outside of the battery;

a second electrical lead entirely outside the battery and in contact with the coating at a second location on the outside of the battery;

a tuning capacitor in parallel to the battery; and an impedance matching capacitor in series with the battery and the tuning capacitor;

placing the battery in a magnetic field;

applying a radio frequency voltage to the circuit; and detecting a $^{7}$Li nuclear magnetic resonance signal in response to the voltage.

2. The method of claim 1, wherein the first and second electrical leads are copper tape applied to the battery.

3. The method of claim 1, wherein the first and second electrical leads are metal clamps attached to the battery.

4. The method of claim 1, wherein the first and second electrical leads are on opposing faces of the battery.

5. The method of claim 1, wherein the tuning capacitor is a variable capacitor.

6. The method of claim 1, wherein applying the radio frequency voltage creates radio frequency fields inside the battery.

7. The method of claim 1, wherein the matching capacitor is a variable capacitor.

8. The method of claim 1, further comprising:

determining the presence of electrolytic lithium, graphite-intercalated lithium, or metallic lithium in the battery based on the nuclear magnetic resonance signal.

* * * * *